United States Patent
Ogasawara et al.

(10) Patent No.: US 9,214,954 B2
(45) Date of Patent: Dec. 15, 2015

(54) INCREASING SPEED OF DATA COMPRESSION

(71) Applicant: International Business Machines Corporation, Armonk, NY (US)

(72) Inventors: Takeshi Ogasawara, Tokyo (JP); Toshio Suganuma, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/640,317

(22) Filed: Mar. 6, 2015

(65) Prior Publication Data

US 2015/0280736 A1 Oct. 1, 2015

(30) Foreign Application Priority Data

Mar. 25, 2014 (JP) ................. 2014-061524

(51) Int. Cl.
*H03M 7/34* (2006.01)
*H03M 7/30* (2006.01)

(52) U.S. Cl.
CPC .................. *H03M 7/3059* (2013.01)

(58) Field of Classification Search
CPC H03M 7/3086; H03M 7/3084; H03M 7/3088
USPC ...................... 341/50, 51, 106, 107
See application file for complete search history.

(56) References Cited

U.S. PATENT DOCUMENTS

| | | | | |
|---|---|---|---|---|
| 5,371,499 A | * | 12/1994 | Graybill et al. | 341/51 |
| 5,406,279 A | * | 4/1995 | Anderson et al. | 341/51 |
| 5,414,704 A | * | 5/1995 | Spinney | 370/389 |
| 5,951,623 A | * | 9/1999 | Reynar et al. | 708/203 |
| 6,359,574 B1 | * | 3/2002 | Yariv | 341/50 |
| 8,766,827 B1 | * | 7/2014 | Milne et al. | 341/51 |
| 8,804,950 B1 | * | 8/2014 | Panwar | 380/28 |
| 2004/0148487 A1 | * | 7/2004 | Mori et al. | 711/216 |

(Continued)

FOREIGN PATENT DOCUMENTS

| | | |
|---|---|---|
| JP | S561910 A | 1/1981 |
| JP | H0683573 B2 | 10/1994 |

(Continued)

OTHER PUBLICATIONS

K. Sadakane, et al., "Improving the Speed of LZ77 Compression by Hashing and Suffix Sorting," IEICE Trans. Fundamentals, vol. E83-A, No. 12, Dec. 2000, pp. 2689-2698.

(Continued)

*Primary Examiner* — Linh Nguyen
(74) *Attorney, Agent, or Firm* — Cantor Colburn LLP; Gall Zarick

(57) ABSTRACT

A computer implemented method of performing data compression includes applying, with a computing device, a hash function to a selected part of a character string to calculate a hash value; searching, using the hash value, through entries in a bucket chain having the hash value previously registered in a hash table, and finding a longest matching character string; acquiring, an index indicating that a longest matching character string cannot be found in the search through the entries and thus the search operation is wasted; and switching the hash function to a different hash function for expanding the selected part of the character string, without reconstructing the hash table, when the index exceeds a predetermined threshold.

10 Claims, 6 Drawing Sheets

(56) References Cited

U.S. PATENT DOCUMENTS

| | | | |
|---|---|---|---|
| 2006/0106870 A1* | 5/2006 | Franaszek et al. | 707/104.1 |
| 2006/0112264 A1* | 5/2006 | Agarwal | 713/150 |
| 2009/0002207 A1* | 1/2009 | Harada et al. | 341/51 |
| 2011/0099175 A1* | 4/2011 | Darcy | 707/747 |

FOREIGN PATENT DOCUMENTS

| | | |
|---|---|---|
| JP | H1185771 A | 3/1999 |
| JP | 2000057151 A | 2/2000 |
| JP | 2009296131 A | 12/2009 |
| JP | 2010515114 A | 5/2010 |
| JP | 2011138230 A | 7/2011 |

OTHER PUBLICATIONS

List of IBM Patents or Patent Applications Treated as Realated; JP920140018US1, Date Filed: Mar. 6, 2015, pp. 1-2.

Takeshi Ogasawara, et al.,"Increasing Speed of Data Compression," U.S. Appl. No. 14/748,310, filed Jun. 24, 2015.

* cited by examiner

INCREASING SPEED OF DATA COMPRESSION

FOREIGN PRIORITY

This application claims priority to Japanese Patent Application No. 2014-061524, filed Mar. 25, 2014, and all the benefits accruing therefrom under 35 U.S.C. §119, the contents of which in its entirety are herein incorporated by reference.

BACKGROUND

The present invention relates to a technique for increasing the speed of data compression, and more specifically, it relates to a technique for performing data compression by applying a hash function to a selected part of a character string to calculate a hash value, searching, using the hash value, through entries in a bucket chain that has the hash value which is previously registered in a hash table, and finding a longest matching character string.

In compressing a file, for example, zip, LHA, gzip, bzip2, or LZMA (Lempel-Ziv-Markov chain-Algorithm) has been used hitherto. In the case of bzip2, a method called blocking sorting is used to achieve a high compression rate. In contrast, zip, LHA, and gzip use a combined method of LZ77 coding and Huffman coding. The LZ77 coding is one of dictionary-based coding methods, in which an input character string (also a symbol string) is registered in a dictionary and encoding is performed using the dictionary.

Dictionary-based coding methods include a static dictionary method and an adaptive dictionary method (also called a dynamic dictionary method). In the static dictionary method, a dictionary is compiled prior to encoding, and encoding is performed based on the dictionary. The static dictionary method needs the same dictionary to be prepared for encoding and decoding. In a method in which a dictionary for decoding is attached to a file, a significant decrease in the compression rate is thus inevitable.

On the other hand, in the adaptive dictionary method, a dictionary is not prepared beforehand and instead is compiled while a file (input stream) is being read. Then, when a character string already registered in the dictionary appears, the character string is converted into a position index in the dictionary for compression. In the adaptive dictionary method, the dictionary is empty in the beginning and thus a character string cannot be compressed at an initial stage. However, as file reading proceeds, a sufficient number of character strings are registered in the dictionary, and therefore a high compression rate of the file can be achieved.

As adaptive dictionary methods, for example, RLE, BPE, Deflate, and LZ coding (Ziv-Lempel coding) are known. As the LZ coding, for example, LZ77, LZ78, LZSS, LZW, LZML, LZO, LZMA, LZX, LZRW, LZJB, LZT and ROLZ are known.

Among the above-mentioned adaptive dictionary methods, the LZ coding is the most well-known method. The LZ coding is roughly categorized into the LZ77 coding (developed in 1977) and the LZ78 coding (developed in 1978). The LZ77 coding and the LZ78 coding are different in the way of compiling a dictionary. In the LZ77 coding, a dictionary is compiled in accordance with a sliding dictionary method, while, in the LZ78 coding, a dictionary is compiled in accordance with a dynamic dictionary method.

The LZ77 coding has many variations. Among them, a widely-used coding in general is the LZSS coding. In the LZSS coding, a sliding window and a longest matching method are used. In programming the LZSS coding, a process of searching a reference part of the sliding window for a longest matching string sequence is performed. In the process for searching for a longest matching sequence, a hash method is used. That is, in the LZSS compression, a hash table is used in order to reduce the time required for a search for a longest matching sequence. A registration of a character string to the hash table is done by obtaining, using a hash function, a hash value for the character string with a predetermined number of characters from the beginning of the input character string and then putting the input character string (precisely, a pointer to the character string) to the hash table. Thus, in the LZSS coding, a dictionary is compiled by calculating a hash value for each character string while sliding the input character string, and at the same time, a longest matching sequence that matches a character string previously registered in the dictionary is identified.

In file compression, various methods have been proposed, aiming at increasing the compression rate, the compression speed, and the decoding speed and improving memory requirements.

JP6-83573 describes a process of the LZW coding which utilizes a list structure of an external hash method for a dictionary search (Claim 1).

JP2009-296131 describes a method for selecting a hash function (Summary).

JP11-85771 describes an algorithm-selection mean for selecting one from multiple pieces of hash value calculation means (Summary).

JP2011-138230 describes achieving a reduction in the size of a data file and a reduction in search noise (Summary).

JP5-61910 describes performing a search by inputting a search character string including multiple characters into hash function generating means, detecting, using a generated hash value, appearance position information of the corresponding characters stored in the above full index, and determining whether or not the detected appearance position information of the individual characters corresponds relatively to the order of position of the search character string (Summary).

JP2010-515114 describes a method and system regarding efficient processing for purposes such as data hashing and/or elimination of data redundancy (paragraph 0001).

JP2000-57151 describes a technique that enables to increase the speed of search performance and to minimize an increase of the total index size (Summary).

Kunihiko Sadakane et. al., "Improving the Speed of LZ77 Compression by Hashing and Suffix Sorting", IEICE transactions on fundamentals of electronics, communications and computer sciences, E83-A, No. 12, pages 2689-2698, December 2000, describes improving the speed of the LZ77 compression by hashing and suffix sorting (Summary).

SUMMARY

In one embodiment, a computer implemented method of performing data compression includes applying, with a computing device, a hash function to a selected part of a character string to calculate a hash value; searching, using the hash value, through entries in a bucket chain having the hash value previously registered in a hash table, and finding a longest matching character string; acquiring, an index indicating that a longest matching character string cannot be found in the search through the entries and thus the search operation is wasted; and switching the hash function to a different hash function for expanding the selected part of the character string, without reconstructing the hash table, when the index exceeds a predetermined threshold.

In another embodiment, an apparatus for performing data compression, includes a computing device configured to apply a hash function to a selected part of a character string to calculate a hash value, search, using the hash value, through entries in a bucket chain having the hash value previously registered in a hash table, and find a longest matching character string, the computing device further including index acquisition means for acquiring an index indicating that a longest matching character string cannot be found in the search through the entries and thus the search operation is wasted; and hash function switching means for switching the hash function to a different hash function for expanding the selected part of the character string, without reconstructing the hash table, when the index exceeds a predetermined threshold.

In another embodiment, a non-transitory, computer readable storage medium having computer readable instructions stored thereon that, when executed by a computer, implement a method of performing data compression. The method includes applying a hash function to a selected part of a character string to calculate a hash value; searching, using the hash value, through entries in a bucket chain having the hash value previously registered in a hash table, and finding a longest matching character string; acquiring, an index indicating that a longest matching character string cannot be found in the search through the entries and thus the search operation is wasted; and switching the hash function to a different hash function for expanding the selected part of the character string, without reconstructing the hash table, when the index exceeds a predetermined threshold.

DETAILED DESCRIPTION

Figure 1:
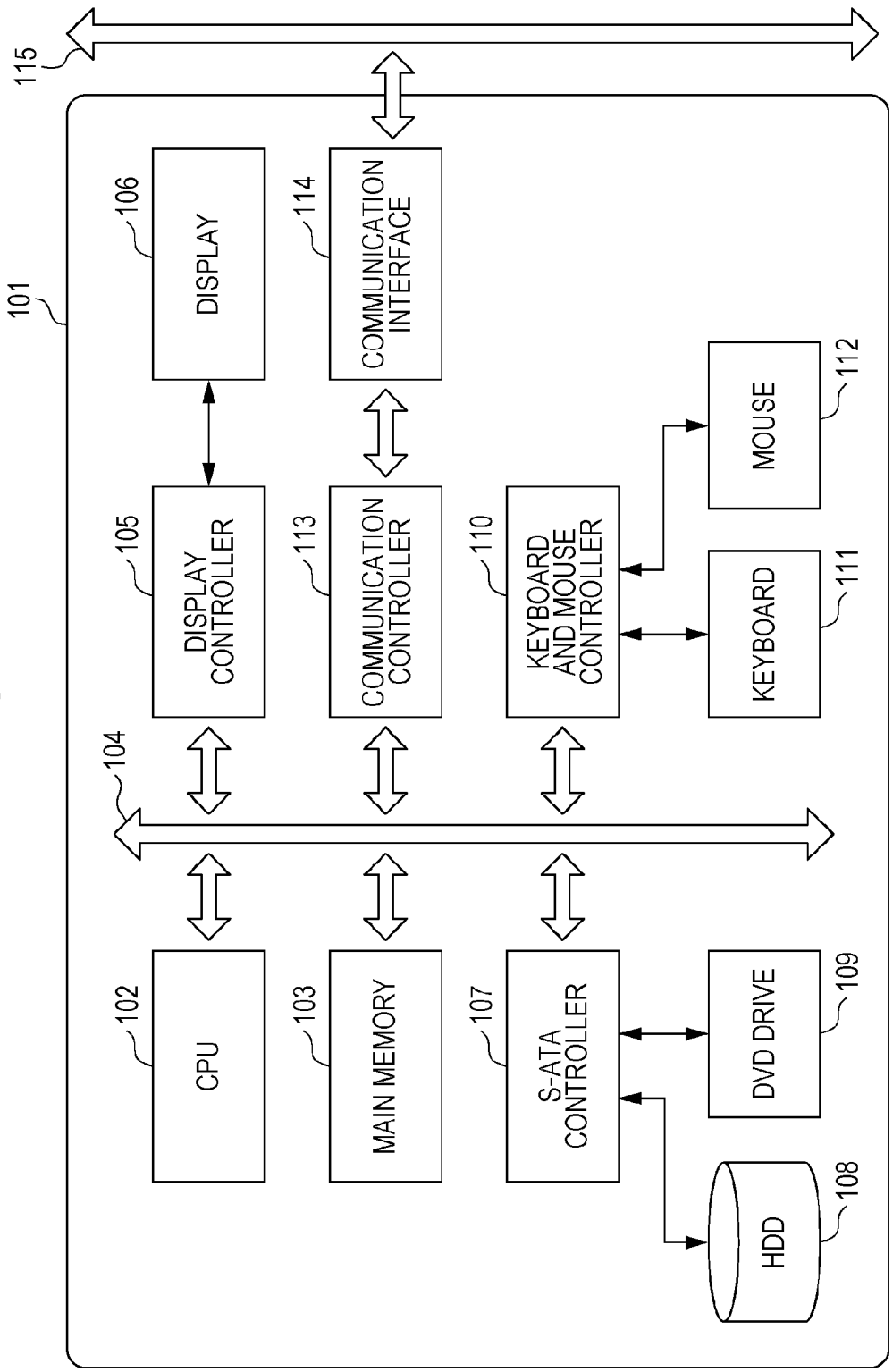
FIG. 1 is a diagram illustrating an example of a computer according to an embodiment of the present invention or a computer which may be used in an embodiment of the present invention.

In the dictionary-based coding method, symbols are not converted into variable-length code words. Instead, variable-length character strings which are so-called "words" or "phrases" are converted into fixed-length code words or variable-length code words.

In the adaptive dictionary method, a dictionary is not compiled beforehand. Instead, while reading character strings to be compressed, a computer registers the character strings into the dictionary sequentially, based on a hash value calculated by applying a hash-value-updating function to the character strings.

In the LZ77 coding, which is one of the adaptive dictionary methods, a sliding window is used. In the LZ77 coding, a computer prepares a buffer that stores a predetermined number of words, and performs encoding using the buffer. Since the size of the buffer is limited, old character strings need to be discarded by the amount of reading new character strings. In the operation, as encoding proceeds, the character strings stored in the buffer appear as if they were sliding through the entire input data of character strings. From this, the buffer is also called a "sliding window".

A sliding window consists of a reference part (for example, a size of 16) and an encoding part (for example, a size of 4). The encoding part is a character string to be compressed. For example, in the LZSS coding under the LZ77 coding, a longest character string that matches the encoding part (also called as a "longest matching sequence") is searched for from the reference part and encoding is performed based on the position information and the length. For example, when the reference part of a sliding window is 8192 and the encoding part is 16, then, the position information has 13 bits, and the length information has 4 bits. Therefore, it is possible to express a code word in a total of 17 bits. However, in this case, a character string of less than two characters cannot be compressed. Encoding is possible only for a character string of three or more characters.

Referencing a dictionary in encoding operation is implemented by searching for a character string that matches a character string starting from a present encoding target position and that is the longest character string (called a longest matching sequence) in the sliding window.

In searching for a longest matching sequence, a process of searching the reference part for a longest matching sequence is important. For example, when the size of the sliding window is N and the size of the encoding part is F, a comparing process needs to be performed N×F times in the worst case. In order to reduce the number of times of comparison, a hash method is used.

In the hash method, an array called a hash table for storing data and a hash function for converting data into numerical values are used. For example, when the size of the hash table is N, a hash function converts data into integer values within a range from 0 to N−1. The integer values are hash values. A hash value corresponds to a subscript of the hash table, and data is stored in this position.

When an unspecified number of data are handled in the hash method, a same hash value may be generated from different data. The generation of the same hash value is a collision of hash values. When a collision of hash values has occurred, it is impossible to register data to the hash table. In order to solve the problem of a collision of hash values, for example, an open address method or a chain method is employed.

In the open address method, a computer prepares a different hash function, and calculates a new hash value by applying the different hash function to a character string. Then, the computer, until an empty slot is found in a hash table, repeats the preparation of a different hash function and the calculation of a new hash value. When an empty slot is found, the computer puts data into the slot.

On the other hand, in the chain method, a computer stores multiple pieces of data into a hash table. However, only one piece of data can be stored in an element of the hash table in the chain method. Therefore, the computer prepares a linked list as a data structure. When searching the hash table for data, the computer first calculates a hash value, and then searches for data from the linked list (also called a bucket chain) of an entry that has the same hash value as the calculated hash value. The bucket chain includes character strings that collide due to having the same hash value. The character strings are stored in the bucket chain in order from the beginning of the bucket chain. However, when a collision of hash values occurs frequently, the linked list for data storage becomes longer, and an extra time is required for scanning the list for a longest matching sequence. Thus, in order to perform a search operation efficiently in the chain method, it is important to select an appropriate hash function so as not to cause collisions too often.

In order to execute searching for a longest matching sequence efficiently, a very lightweight hash function is used. As mentioned above, in the data compression algorithm, such as a data compression algorithm in which a dictionary may be used as a hash table, a longest matching sequence that matches between the present data of the input data (also called an input stream) and the data stored in the hash table (dictionary) is searched for.

Figure 2:
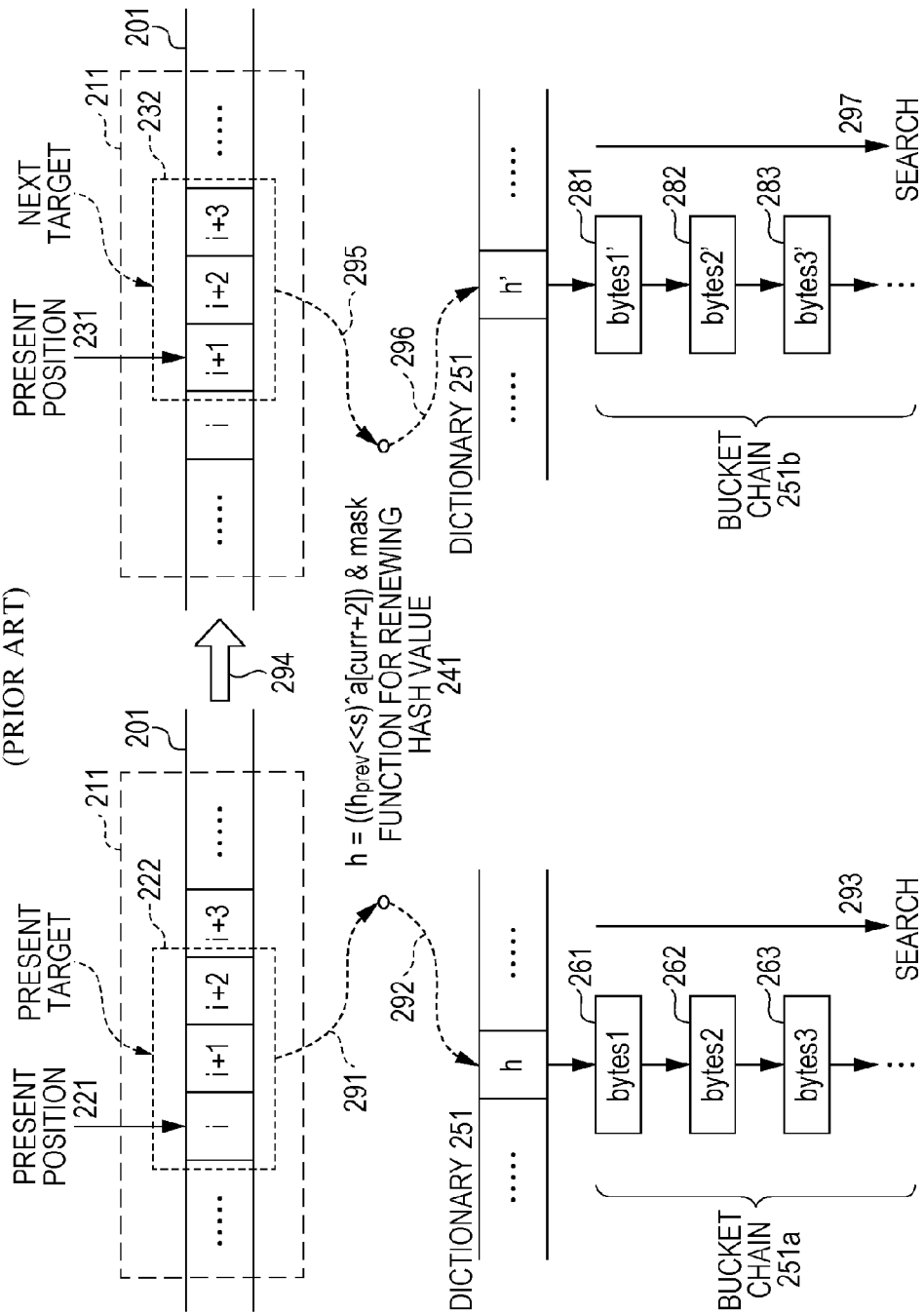
FIG. 2 is a diagram for explaining a process of applying a hash-value-updating function to a selected part of a character string to calculate a hash value, searching, using the calculated hash value, through individual entries in a bucket chain which has the hash value previously registered in a hash table, and finding a longest matching character string, in accordance with a conventional method.

FIG. 2 is a diagram for explaining a process of applying a hash-value-updating function to a selected part of a character string to calculate a hash value, searching, using the hash value, through individual entries in a bucket chain which has the hash value previously registered in the hash table, and finding a longest matching character string, in accordance with a conventional method.

An input stream (201) is a file as a data compression target and includes character strings. A computer reads from the input stream (201) predetermined fixed-length bytes of character strings into a buffer (that is, a sliding window) (211). It is assumed that the computer uses, as data to which the hash function described below is to be applied, "i, i+1, i+2", which is a character string (222) with a predetermined fixed-length of bytes (3 bytes in the example in FIG. 2) and whose starting position is the present position of the character string "i" (present position: 221).

The computer applies a hash-value-updating function (241) to the above-mentioned character string (222) and calculates a hash value h (291). The computer checks (292), using the calculated hash value h, whether the hash value h is registered in the dictionary (251). The computer newly registers the hash value h to the dictionary (251). When the hash value h is already registered in the dictionary (251), the computer searches through entries (261, 262, 263, . . . ) in a bucket chain (251a) that has the hash value h, to find (293) a longest character string that matches the character string starting from the present position (221).

In the above example illustrated in FIG. 2, since the above calculated hash value h is registered in the dictionary (251) and a collision of the hash value h has occurred, the computer searches through the individual entries (261, 262, 263, . . . ) in the bucket chain (251a) that has the hash value h, to find (293) a longest character string that matches the character string starting from the present position (221). The computer searches for the longest matching character string (293) up to the end of the entries (261, 262, 263, . . . ) of the above-mentioned bucket chain (251a) or up to an upper limit of the search for the entries (261, 262, 263, . . . ). The search upper limit for the entries may be set in such a manner that the higher the compression level (for example, a minimum compression level, a default compression level, or a maximum compression level) of the data compression algorithm (that is, as the compression becomes higher), the larger the number of entries are searched.

In order to find a longest character string that matches the character string starting from the present position (221), the computer sequentially compares the character string starting from the present position (221) with character strings in the dictionary.

When the computer finds, in the individual entries (261, 262, 263, . . . ) in the above-mentioned bucket chain (251a) associated with the hash value h, a character string "abc" (that is, a character string which matches a[i]b[i+1]c[i+2]) (since the function (241) for updating the hash value uses 3 bytes in this case, matching with the minimum of 3 characters) and a character string "abcd" (that is, a character string which matches a[i]b[i+1]c[i+2]d[i+3]), the computer returns the character string "abcd" as a longest matching character string (a longest matching sequence).

Next, the computer shifts (232), in the sliding window (211), the present position by one from the position of the character string "i" (221) to the position of the character string "i+1" (231). Therefore, it is assumed that the computer uses, as data to which the hash function mentioned below is to be applied, "i+1, i+2, i+3", which is the character string (232) with a predetermined fixed-length of bytes (3 bytes in the example in FIG. 2) and whose starting position is the present position of the character string "i+1" (present position: 231). The character string (232) currently being processed, "i+1, i+2, i+3", includes "i+1, i+2" in the character string "i, i+1, i+2" (222), which was processed in the previous operation.

The computer applies the function (241) for updating the hash value to the above-mentioned character string (232) and calculates a hash value h' (295). The computer checks (296), using the calculated hash value h', whether the hash value h' is registered in the dictionary (251). The computer newly registers the hash value h' to the dictionary (251). When the hash value h' is already registered in the dictionary (251), the computer searches through individual entries (281, 282, 283, . . . ) in a bucket chain (251b) that has the hash value h', to find (297) a longest character string that matches the character string starting from the present position (231).

In the above example illustrated in FIG. 2, since the above calculated hash value h' is registered in the dictionary (251) and a collision of the hash value h' has occurred, the computer searches through the individual entries (281, 282, 283, . . . ) in the bucket chain (251b) that is associated with the hash value h', to find (297) a longest character string that matches the character string starting from the present position (231). The computer searches for the longest matching character string (297) up to the end of the entries (281, 282, 283, . . . ) of the above-mentioned bucket chain (251b) or up to the search upper limit for the entries (281, 282, 283, . . . ). The search upper limit for the entries may be set in such a manner that the higher the compression level (for example, a minimum compression level, a default compression level, or a maximum compression level) of the data compression algorithm (that is, as the compression becomes higher), the larger the number of entries are searched.

Thereafter, the computer processes character strings likewise in sequence by shifting the present position in the sliding window (211) one by one. After completing the process for the character strings in the sliding window (211), the computer clears the sliding window (211), reads subsequent character strings of the predetermined fixed-length of bytes from the input stream (201) to the sliding window (211), and processes character strings in the sliding window (211) likewise in sequence.

To enhance overall performance, it is necessary that a hash function itself is lightweight, as described above. In the example illustrated in FIG. 2, a new hash value is calculated by using the previous hash value and 1 byte of a new input character, unlike an ordinary hash function. A function for updating a hash value calculates a new hash value from the previous hash value and a new byte c according to the following expression.

$$new\_value = (((prev\_value) << hash\_shift)\,\hat{}\,(c))\ \&\ hash\_mask),$$

new_value: new hash value
prev_value: previous hash value
hash_shift: hash shift
c: new byte
hash_mask: hash mask The above-mentioned hash mask represents masking of a value by the size of a hash table. The hash mask is used so that the calculated hash value fits within the table size of the hash table.

For example, the number of hash bits may be 15 (a hash table size of 32 K) and the number of hash shifts may be 5. In the case where the number of hash shifts is 5, moving the present position by one character shifts the previous key by 5 bits. That is, only 5 bits of one character are used for the hash calculation. Therefore, 3 bits in the first byte are not necessarily used for the hash calculation, which increases the probability of hash collisions.

Figure 3:
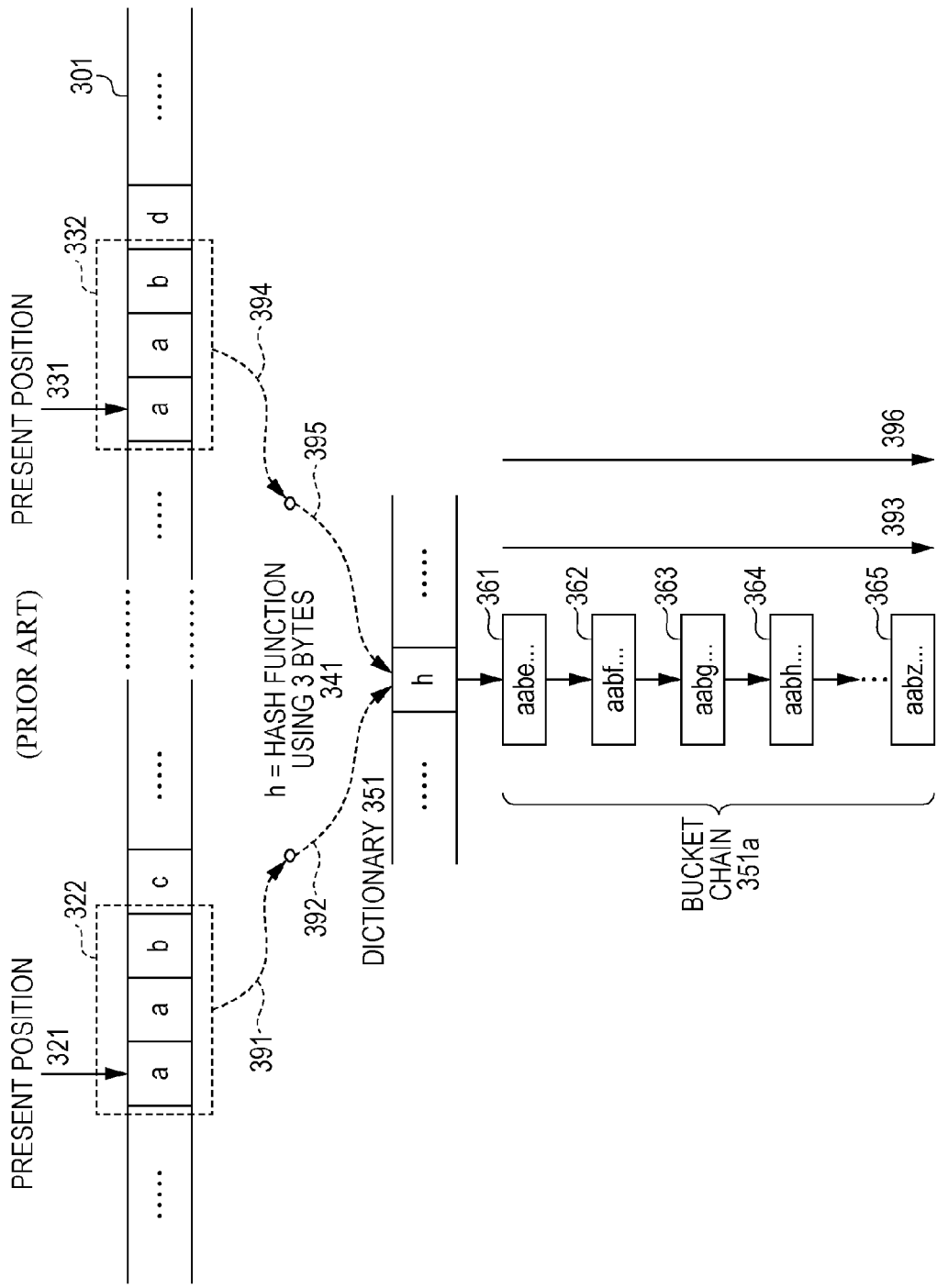
FIG. 3 is a diagram for explaining that in the case where a hash function is applied to a selected part of a character string to calculate a hash value, according to a conventional method, a hash index collision occurs and redundant loop iterations occur in the search through entries of a bucket chain, without finding a longest matching character string.

FIG. 3 is a diagram for explaining that in the case where a hash function is applied to a selected part of a character string to calculate a hash value, according to a conventional method, a hash index collision occurs and redundant loop iterations occur in the search through entries in a bucket chain, without finding a longest matching character string.

An input stream (301) is a file as a data compression target and includes character strings. It is assumed that the computer uses, as data to which the hash function described below is to be applied, "a, a, b", which is a character string (322) with a predetermined fixed-length of bytes (3 bytes in the example in FIG. 3) and whose starting position is the present position of the character string "a" (present position: 321).

The computer applies a hash function (341) that uses 3 bytes of the above-mentioned character string (322) and calculates a hash value (391). The computer checks (392), using the calculated hash value h, whether the hash value h is registered in a dictionary (351). The computer newly registers the hash value h to the dictionary (351). When the hash value h is already registered in the dictionary (351), the computer searches through individual entries (361, 362, 363, 364, . . . , and 365) in a bucket chain (351a) that has the hash value h, to find (393) a longest character string that matches the character string starting from the present position (321).

In the above example illustrated in FIG. 3, since the above calculated hash value h is registered in the dictionary (351) and a collision of the hash value h has occurred, the computer searches through the individual entries (361, 362, 363, 364, . . . , and 365) in the above-mentioned bucket chain (351a) that has the hash value h, to find (393) a longest character string that matches the character string starting from the present position (321). The computer searches for the longest matching character string (393) up to the end of the entries (361, 362, 363, 364, . . . , and 365) in the above-mentioned bucket chain (351a) or up to the search upper limit for the entries (361, 362, 363, 364, . . . , and 365). The search upper limit for the entries may be set in such a manner that the higher the compression level (for example, a minimum compression level, a default compression level, or a maximum compression level) of the data compression algorithm (that is, as the compression becomes higher), the larger the number of entries are searched.

The computer searches through the individual entries (361, 362, 363, 364, . . . , and 365) in the above-mentioned bucket chain (351a) that has the hash value h, to find a character string that matches a character string "aabc". However, the computer cannot find such an entry that matches the character string "aabc" by searching through all the specified entries (for example, 4096 entries in the case of the maximum compression level). Accordingly, even by searching through a large number of entries, a higher compression effect cannot be achieved.

It is assumed that the computer continuously uses, as data to which the hash function described below is to be applied, "a, a, b", which is a character string (332) with a predetermined fixed-length of bytes (3 bytes in the example in FIG. 3) and whose starting position is the present position of the character string "a" (present position: 331).

The computer applies the hash function (341) that uses 3 bytes to the above-mentioned character string (332) and calculates a hash value (394). The computer checks (395), using the calculated hash value h, whether the hash value h is registered in the dictionary (351). The computer newly registers the hash value h to the dictionary (351). When the hash value h is already registered in the dictionary (351), the computer searches through the individual entries (361, 362, 363, 364, . . . , and 365) in the bucket chain (351a) that has the hash value h, to find (396) a longest character string that matches the character string starting from the present position (331).

In the above example illustrated in FIG. 3, since the above calculated hash value h is registered in the dictionary (351) and a collision of the hash value h has occurred, the computer searches through the individual entries (361, 362, 363, 364, . . . , and 365) in the bucket chain (351a) that has the hash value h, to find (396) a longest character string that matches the character string starting from the present position (331). The computer searches for the longest matching character string (396) up to the end of the entries (361, 362, 363, 364, . . . , and 365) in the above-mentioned bucket chain (351a) or up to the search upper limit for the entries (361, 362, 363, 364, . . . , and 365). The search upper limit for the entries is set as described above.

The computer searches through the individual entries (361, 362, 363, 364, . . . , and 365) in the above-mentioned bucket chain (351a) that has the hash value h, to find a character string that matches a character string "aabd". However, the computer cannot find such an entry that matches the character string "aabd" by searching through all the specified entries (for example, 4096 entries in the case of the maximum compression level). Accordingly, even by searching through a large number of entries, a higher compression effect cannot be achieved.

In the above examples, character strings (322, 332) have the same first three characters "a, a, b" and the different fourth character ("c" in the case of the character string (322) and "d" in the case of the character string (332)). In such a case, a hash function that uses 3 bytes, which is a fixed length, causes a large number of collisions, and as a result, creates a long bucket chain. In addition, without being able to find a character string that matches the fourth character and thereafter from the entries (361, 362, 363, 364, . . . , and 365) in the bucket chain (351a), loop iterations occur in the search through the individual entries (361, 362, 363, 364, . . . , and 365) of the bucket chain (351a). That is, in the above example, the hash function that uses 3 bytes, which is a fixed length, generates a clustering result of the hash values for some type of character strings (for example, the above-mentioned character strings (322, 332)), and thus degrades the performance.

The above-mentioned problem of loop iterations, in particular, when a high compression level is specified, could result in unchanged or rather decreased compression rate, while a long CPU time is required for compression.

Accordingly, embodiments of the present invention improve the performance in data compression, in the case where a longest matching character string cannot be found in a search through entries in a bucket chain which has a hash value previously registered in a hash table.

Embodiments of the present invention also reduce the number of hash collisions in the case where a longest matching character string cannot be found in a search through entries in a bucket chain which has a hash value previously registered in a hash table.

Disclosed herein is a technique for increasing the speed of data compression. The technique may include a method for the data compression, a computer for performing the data compression, a computer program, and a computer program product. Embodiments of the present invention, in particular, relates to a compression algorithm for performing above-mentioned data compression. Embodiments of the present invention may include a computer including the above-mentioned compression algorithm, a computer program, and a computer program product.

A first aspect of the present invention provides a method for performing data compression by applying a hash function to a selected part of a character string to calculate a hash value, searching, using the hash value, through entries in a bucket chain having the hash value previously registered in a hash table, and finding a longest matching character string, which includes: acquiring an index indicating that a longest matching character string cannot be found in the search through the entries and thus the search operation is wasted; and switching the hash function to a different hash function by expanding the selected part of the character string in the hash calculation, without reconstructing the hash table, when the index exceeds a predetermined threshold, wherein the acquiring and the switching are performed by a computer.

According to an embodiment of the present invention, the method may further include returning the different hash function to the original hash function at a specific timing, which is performed by the computer.

According to an embodiment of the present invention, returning the different hash function to the original hash function may be performed at a time when the hash table is cleared or every time that character strings of a predetermined length is processed.

According to an embodiment of the present invention, the index may represent a time required for a search when an entry of a character string being searched for cannot be found up to the last entry in the bucket chain having the hash value or up to a search upper limit of entries in the bucket chain having the hash value.

In an embodiment of the present invention, the index may represent a frequency at which an entry of a character string being searched for cannot be found even when the search is performed up to the last entry in the bucket chain having the hash value or even when the search is performed up to a search upper limit of entries in the bucket chain having the hash value.

A second aspect of the present invention provides a computer for performing data compression by applying a hash function to a selected part of a character string to calculate a hash value, searching, using the hash value, through entries in a bucket chain having the hash value previously registered in a hash table, and finding a longest matching character string, which includes: index acquisition means for acquiring an index which indicates that a longest matching character string cannot be found in the search through the entries and thus the search operation is wasted; and hash function switching means for switching the hash function to a different hash function by expanding the selected part of the character string in the hash calculation, without reconstructing the hash table, when the index exceeds a predetermined threshold.

According to an embodiment of the present invention, the computer may further include hash function restoration means for restoring the different hash function to the original hash function at a specific timing.

According to an embodiment of the present invention, the restoration means may restore the different hash function to the original hash function at a time when the hash table is cleared or every time that character strings of a predetermined length is processed.

According to an embodiment of the present invention, the index may represent a time required for a search when an entry of a character string being searched for cannot be found up to the last entry in the bucket chain having the hash value or up to a search upper limit of entries in the bucket chain having the hash value.

According to an embodiment of the present invention, the index may represent a frequency at which an entry of a character string being searched for cannot be found even when the search is performed up to the last entry in the bucket chain having the hash value or even when the search is performed up to a search upper limit of entries in the bucket chain having the hash value.

A third aspect of the present invention provides a non-transitory, computer readable storage medium having computer readable instructions stored thereon that, when executed by a computer, implement a method of performing data compression according to the first aspect described above.

A computer program according to an embodiment of the present invention may be stored in desired one or more computer-readable recording media, such as a flexible disk, an MO, a CD-ROM, a DVD, a BD, a hard disk device, a memory medium connectable to a USB, a ROM, an MRAM, and a RAM. In order to store the computer program into the recording medium, the computer program may be downloaded from a different computer, such as a server computer, which is connected via a communication line or may be duplicated from a different recording medium. Further, a computer program according to an embodiment of the present invention may be compressed or divided into plural programs, and may be stored into a single or plural recording media. Further, it should be noted that obviously a computer program product according to an embodiment of the present invention may be provided in various forms. A computer program product according to an embodiment of the present invention may include, for example, a storage medium on which the above-mentioned computer program is recorded or a transmission medium for transmitting the above-mentioned computer program.

It is obvious that various modifications, such as combining the individual hardware elements of a computer used in an embodiment of the present invention with plural machines, distributing functions to the combined hardware elements and machines, and causing the combined hardware elements and machines to execute the functions, may be easily conceived by those skilled in the art. Such modifications are naturally included in the spirit of the present invention. However, the above-mentioned elements are merely exemplifications and all the elements are not necessarily essential to the present invention.

Furthermore, embodiments of the present invention may be implemented as hardware, software, or a combination of hardware and software. Execution in a computer into which the above-mentioned computer program is installed is a typical example of execution by a combination of hardware and software. In such a case, by execution of the computer program loaded to a memory of the computer, the computer program controls the computer and executes processing according to the present invention. The computer program may include an instruction group that may be expressed by a desired language, code, or notation. Such an instruction group enables the computer to directly perform processing according to the embodiment of the present invention or to perform the processing according to the embodiment of the present invention after one or both of 1: conversion into a different language, code, or notation; and 2: duplication to a different medium are performed.

According to the embodiments of the present invention, when an index which indicates that a longest matching character string cannot be found in the search through entries in the bucket chain which has the hash value previously registered in the hash table and thus the search operation is wasted, exceeds a predetermined threshold, the hash function is switched to a different hash function that expands the selected part of the character string, without reconstructing the hash table. This makes it possible for an arithmetic processing unit (for example, a CPU) to dynamically avoid wasting time which is required to process a long bucket chain. Therefore, the performance in data compression is improved.

Further, according to the embodiments of the present invention, as mentioned above, the hash function is switched to the different hash function that expands the selected part of the character string, without reconstructing the hash table, which significantly reduces the number of hash collisions. Therefore, the performance in data compression is improved.

Embodiments of the present invention will be described with reference to figures hereinafter. For all the figures below, the same signs indicate the same objects unless otherwise stated. It should be understood that embodiments of the present invention are to describe preferred embodiments of the present invention and are not intended to limit the scope of the invention to what is described here.

A computer which may be used in an embodiment of the present invention is not limited in particular, as long as it is able to compress data. The computer may be, for example, a mainframe computer, a server computer, a desktop computer, a notebook computer, or an all-in-one personal computer, or a tablet terminal or a smart phone (for example, a tablet terminal or a smart phone with Windows®, Android®, or iOS).

FIG. 1 is a diagram illustrating an example of a computer according to an embodiment of the present invention or a computer which may be used in an embodiment of the present invention.

A computer (101) includes a CPU (102) and a main memory (103) which are connected to a bus (104). Preferably, the CPU (102) is based on the architecture of 32 bits or 64 bits. The CPU (102) may be, for example, Core™ i series, Core™ 2 series, Atom™ series, Xeon® series, Pentium® series, or Celeron® series by Intel, A series, Phenom™ series, Athlon™ series, Turion® series, or Sempron™ by AMD (Advanced Micro Devices), or Power™ series by International Business Machines Corporation.

To the bus (104), a display (106), such as a liquid crystal display (LCD), may be connected via a display controller (105). A liquid crystal display (LCD) may be, for example, a touch panel display or a floating touch display. The display (106) may be used for displaying, by a suitable graphic interface, an object to be displayed by running software which is operating on the computer (101) (for example, a computer program according to an embodiment of the present invention or various computer programs operating on the computer (101)).

To the bus (104), a disk (108), such as a hard disk or a solid state drive (SSD), may be optionally connected via, for example, an SATA or IDE controller (107).

To the bus (104), a drive (109), such as a CD, DVD, or BD drive, may be optionally connected via, for example, the SATA or IDE controller (107).

To the bus (104), a keyboard (111) and a mouse (112) may be optionally connected via a peripheral device controller (110), such as a keyboard and mouse controller or an USB bus.

The disk (108) may store an operating system, such as z/OS®, z/VM®, z/VSE®, z/TPF, VOS3, UNIX®, Windows®, or MacOS®, a Java® processing environment such as J2EE, a Java® application, a Java® virtual machine (VM), a program providing a Java® Just-In-Time (JIT) compiler, a computer program according to an embodiment of the present invention, and other programs and data in such a manner that they are able to be loaded into the main memory (103).

The disk (108) may be built in the computer (101), may be connected to the computer (101) through a cable so that the disk (108) may be accessed by the computer (101), or may be connected to the computer (101) through a wired or wireless network so that the disk (108) may be accessed by the computer (101).

The drive (109) may be used, as needed, to install programs, such as an operating system, an application, and a computer program according to an embodiment of the present invention, to the disk (108) from a CD-ROM, a DVD-ROM, or a BD.

A communication interface (114) conforms, for example, to an Ethernet® protocol. The communication interface (114) is connected to the bus (104) via a communication controller (113), has a role of connecting the computer (101) to a communication line (115) in a wired or wireless manner, and provides a TCP/IP communication protocol, which is a communication function of an operating system of the computer (101), with a network interface layer. The communication line may be, for example, a wireless LAN environment according to wireless LAN connection standards, a Wi-Fi wireless LAN environment such as IEEE 802.11a/b/g/n, or a cellular phone network environment (for example, a 3G or 4G environment).

Figure 4:
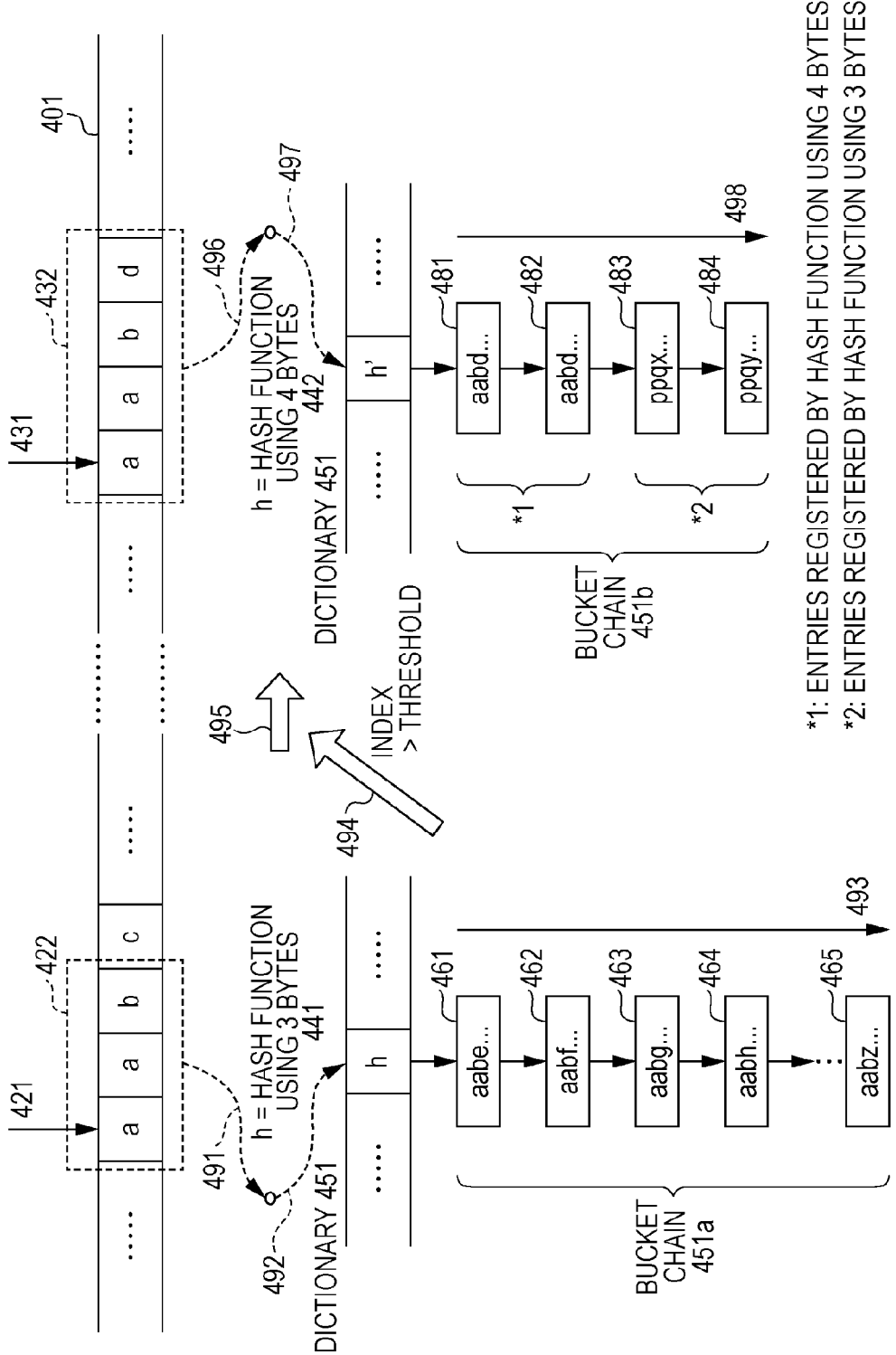
FIG. 4 is a diagram for explaining a process of switching a hash function to a different hash function that expands a selected part of a character string, without reconstructing a hash table, according to an embodiment of the present invention, in the case where an index indicating that a longest matching character string cannot be found in the search through individual entries in a bucket chain previously registered in a hash table and thus the search operation is wasted, exceeds a predetermined threshold.

FIG. 4 is a diagram for explaining a process of switching a hash function to a different hash function that expands a selected part of a character string, without reconstructing a hash table, according to an embodiment of the present invention, in the case where an index which indicates that a longest matching character string cannot be found in a search through individual entries in a bucket chain previously registered in the hash table and thus the search operation is wasted, exceeds a predetermined threshold.

An input stream (401) is a file as a data compression target and includes character strings. The computer (101) reads character strings of a predetermined fixed-length-byte from the input stream (401) into a buffer (that is, a sliding window) (not illustrated). It is assumed that the computer (101) uses, as data to which the hash function described below is to be applied, "a, a, b", which is a character string (422) with a predetermined fixed-length of bytes (3 bytes in the example in FIG. 4) and whose starting position is the present position of the character string "a" (present position: 421).

The computer (101) applies a hash function (441) that uses 3 bytes to the above-mentioned character string (422) and calculates a hash value (491). The computer (101) checks (492), using the calculated hash value h, whether the hash value h is registered in a dictionary (451). The computer (101) newly registers the hash value h to the dictionary (451). When the hash value h is already registered in the dictionary (451), the computer (101) searches through individual entries (461, 462, 463, 464, . . . , and 465) in a bucket chain (451*a*) that has the hash value h, to find (493) a longest character string that matches the character string starting from the present position (421).

In the above example illustrated in FIG. 4, since the above calculated hash value h is registered in the dictionary (451) and a collision of the hash value h has occurred, the computer (101) searches through the individual entries (461, 462, 463, 464, . . . , and 465) in the above-mentioned bucket chain (451*a*) that has the hash value h, to find (493) a longest character string that matches the character string starting from the present position (421). The computer (101) searches for the longest matching character string (493) up to the end of the entries (461, 462, 463, 464, . . . , and 465) in the above-mentioned bucket chain (451*a*) or up to the search upper limit for the entries (461, 462, 463, 464, . . . , and 465). The search upper limit for the entries may be set in such a manner that the higher the compression level (for example, a minimum compression level, a default compression level, or a maximum compression level) of the data compression algorithm (that is, as the compression becomes higher), the larger the number of entries are searched.

The computer (101) acquires an index which indicates that a longest matching character string (that is, "a, a, b, c") cannot be found in the search through the individual entries (461, 462, 463, 464, . . . , and 465) in the bucket chain (451*a*) that has the hash value previously registered in the dictionary (451) and thus the search operation is wasted.

The computer (101) determines whether the above acquired index exceeds a predetermined threshold (494). When the above index exceeds the predetermined threshold, the computer (101) switches (495) the hash function that uses 3 bytes (the hash function currently in use) (441) to a hash function that uses 4 bytes (a different hash function that expands a selected part of a character string) (442), without reconstructing the dictionary (451). The switching to the new hash function that uses 4 bytes (495) is executed on the fly.

It is assumed that the computer (101) continues to use, as data to which the hash function described below is to be applied, "a, a, b, d", which is a character string (432) with a predetermined fixed-length of bytes (4 bytes in the example in FIG. 4) and whose starting position is the present position of the character string "a" (present position: 431).

The computer (101) applies the hash function (442) that uses 4 bytes to the above-mentioned character string (432) and calculates a hash value h' (496). The computer (101) checks (497), using the calculated hash value h', whether the hash value h' is registered in the dictionary (451).

The contents of the dictionary (451) are updated from the original contents, in the respect that the updated contents include character strings registered in the above-mentioned bucket chain (451*b*), by applying the hash function (442) that uses 4 bytes, which is acquired after switching (495) from the hash function (441) that uses 3 bytes to the hash function (442) that uses 4 bytes. That is, the dictionary (451) has entries (newly registered entries) registered in the above-mentioned bucket chain (451*b*) (481 and 482) (that is, entries having the hash value h' (481 and 482)) by applying the hash function (442) that uses 4 bytes. Further, the dictionary (451) also has entries having the hash value h' (483 and 484). The entries (483 and 484) are previously registered in the above-mentioned bucket chain (451*b*) by applying the hash function (441) that uses 3 bytes before the above-mentioned switching is performed.

The computer (101) newly registers the hash value h' to the dictionary (451). When the hash value h' is already registered in the dictionary (451), the computer searches through individual entries (481, 482, 483, and 484) in the bucket chain (451*b*) that has the hash value h', to find (498) a longest character string that matches the character string starting from the present position (431).

The above-mentioned switching from the hash function that uses 3 bytes (441) to the hash function that uses 4 bytes (442) leads to modifying the dictionary into a form with a better search efficiency when character strings are registered in the dictionary.

In the above example illustrated in FIG. 4, since the above calculated hash value h' is registered in the dictionary (451) and a collision of the hash value h' has occurred, the computer (101) searches through the individual entries (481, 482, 483, and 484) in the bucket chain (451*b*) that has the hash value h', to find (498) a longest character string that matches the character string starting from the present position (431).

In the above example illustrated in FIG. 4, the computer (101) searches through the entries (481, 482, 483, and 484) in the bucket chain (451*b*), and finds an entry (481) which has the character string "aabd". That is, it is possible for the computer (101) to find a longest matching character string from the entries (481) in the bucket chain (451*b*) with a small number of entries (that is, the chain is short). Finding the above-mentioned longest matching character string from the bucket chain with a small number of entries shortens the search time from a bucket chain, resulting in better performance.

Although the entries (483 and 484) are not the character strings starting from the character string "aabd", they are not harmful. This is because the entries (483 and 484) are excluded by a search for a matching character string, and they may be put out of the sliding window (current buffer) soon by the effect of sliding window.

As illustrated in FIG. 4, the process of switching a hash function to a different hash function that expands a selected part of a character string is especially effective when compressing the data file described below.

Zlib is a type of compression format using a Deflate algorithm, and functions as a container of a Deflate stream. The Deflate algorithm is an algorithm for performing data compression that uses a combination of the Huffman coding and the LZ77. The Deflate algorithm employs a hash function that uses 3 bytes. In the case where the Deflate algorithm is used to create a PDF file, input data may include font data embedded in the input data. For example, in the case of a TrueType® font, a font file includes several tables, such as an hmtx (horizontal metrics) table and a loca (a location index of outline data in a glyf table) table. Each of the table data is a 4-byte data array and the data is stored in order. That is, in the 4-byte array, data is arranged with the first three bytes being the same and the fourth byte being different.

The above-mentioned feature of the TrueType® file font, that is, the feature that the above-mentioned table data is a 4-byte data array, causes a large number of collisions between hash values calculated by applying a hash function that uses 3 bytes (that is, the Deflate algorithm). Therefore, a bucket chain having a colliding hash value which is previously registered in a hash table becomes long.

According to an embodiment of the present invention, the computer which compresses the above-mentioned pdf file, starts compressing the above-mentioned TrueType® font data in the pdf file by a hash function that uses 3 bytes, and detects that the index, which indicates that the search operation is wasted, exceeds a predetermined threshold. Next, the computer, in response to the detection, switches the hash function that uses 3 bytes currently in use to a hash function that uses 4 bytes, without reconstructing a hash table. By switching to the hash function that uses 4 bytes, the computer registers a character string to the hash table, using the hash value calculated by applying the hash function that uses 4 bytes. Therefore, the table data is well distributed among different hash values, and thereby the number of hash value collisions being decreased. Thus, the above-mentioned bucket chain is prevented from becoming long.

Figure 5:
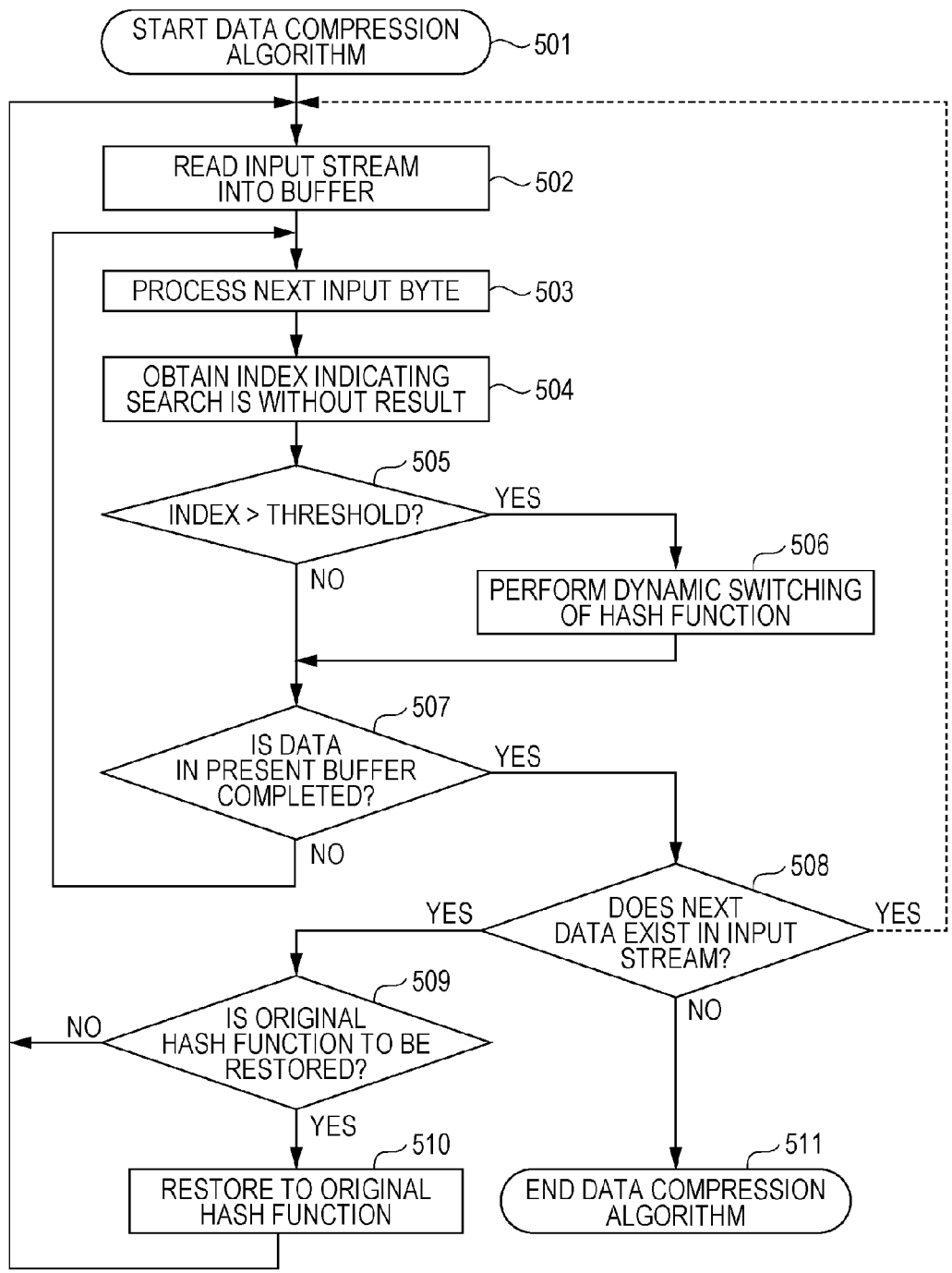
FIG. 5 is a diagram illustrating a process of performing data compression by switching a hash function to a different hash function that expands a selected part of a character string, according to an embodiment of the present invention.

FIG. 5 is a diagram illustrating a process of performing data compression by switching a hash function to a different hash function that expands a selected part of a character string, according to an embodiment of the present invention.

In operation 501, the computer (101) reads a data compression algorithm to the memory (103) and starts the process of data compression. The data compression algorithm is able to use a hash table as a dictionary and may be an algorithm for performing data compression while dynamically compiling a dictionary. For example, the data compression algorithm may be a compression algorithm according to the adaptive dictionary method. The compression algorithm according to the adaptive dictionary method is an algorithm that compiles a dictionary while reading a file, without preparing a dictionary beforehand, as described above, and that performs compression by finding a character string in the file that matches the one registered in the dictionary and converting it into a position index in the dictionary.

In operation 502, the computer (101) reads a file for data compression from, for example, the storage medium (108), uses the file as an input stream, and reads a predetermined number of character strings in the input stream into the buffer (103). The buffer (103) may be a sliding window.

In operation 503, the computer (101) processes a character string read into the above-mentioned buffer (103) by moving the character string by 1 byte in order from the beginning thereof. That is, the computer (101) selects a character string of a predetermined number of bytes from the present position, applying a hash function to the selected part of the character string, and calculates a hash value. Then, using the hash value, the computer (101) searches through individual entries in a bucket chain that has the hash value previously registered in the hash table, to find a longest matching character string. The computer (101) performs the process of searching for the longest character string that has the calculated hash value of the hash function, by shifting the character string in the above buffer (103) by 1 byte in order from the present position.

In operation 504, the computer (101) acquires an index which indicates that a longest matching character string cannot be found in the search, using the hash value calculated in operation 503, through individual entries in the bucket chain previously registered in the hash table, and thus the search operation is wasted. The computer (101) may acquire the above-mentioned index, while the data compression algorithm is performing data compression, for example, continuously, intermittently, or with predetermined time intervals.

The index may be an index represented as follows: (1) a time required for search when an entry of a character string being searched for cannot be found up to the last entry in a bucket chain having a hash value calculated by applying a hash function to a selected part of a character string or (2) a time required for search when an entry of a character string being searched for cannot be found up to the search upper limit for entries in a bucket chain having a hash value calculated by applying a hash function to a selected part of a character string; or (3) a frequency at which an entry of a character string being searched for cannot be found even when search is performed up to the last entry in a bucket chain having a hash value calculated by applying a hash function to a selected part of a character string or (4) a frequency at which an entry of a character string being searched for cannot be found even when search is performed up to the search upper limit for entries in a bucket chain having a hash value calculated by applying a hash function to a selected part of a character string.

Each time represented by (1) may correspond to a (actual) time necessary for the arithmetic processing unit (for example, a CPU) to perform search up to the last entry in the bucket chain. Each time represented by (2) may correspond to a (actual) time necessary for the arithmetic processing time (for example, a CPU) to perform search through the entries of the character string in the bucket chain up to the search upper limit.

Each frequency represented by (3) may be a value obtained by dividing the number of times the search through the entries in the bucket chain was performed up to the last entry in the bucket chain by the total number of times the search through the entries in the bucket chain was called. Each frequency represented by (4) may be a value obtained by dividing the number of times the search through the entries in the bucket chain was performed up to the search upper limit by the total number of times the search through the entries in the bucket chain was called.

In (2) and (4), the search upper limit for entries may be set in such a manner that the higher the compression level (for example, a minimum compression level, a default compression level, or a maximum compression level) of the data compression algorithm (that is, as the compression becomes higher), the larger the number of entries are searched. The search upper limit may be, for example, set within a program beforehand. The search upper limit may be, for example, 128 entries in the case of the default compression level and 4096 entries in the case of the maximum compression level. The smaller the number of search upper limit entries, the shorter the search time and the lower the compression rate. In contrast, the larger the number of search upper limit entries, the longer the search time and the higher the compression rate.

In operation 505, the computer (101) determines whether the index acquired in operation 504 exceeds a predetermined threshold. When the index exceeds the predetermined threshold, the computer (101) proceeds to operation 506. In contrast, when the index does not exceed the predetermined threshold, the computer (101) proceeds to operation 507.

The above-mentioned index is used for switching a hash function, as represented by operation 506, which will be described below, in order to achieve an object of reducing the time required for search through entries in a bucket chain up to the last entry or up to the search upper limit, the problem being generated as the bucket chain of a hash table becomes longer, or an object of reducing the number of collisions of a hash value.

In operation 506, the computer (101) switches, when the above-mentioned index exceeds the predetermined threshold, the hash function currently in use to a different hash function that expands a selected part of a character string, without reconstructing a hash table. Regarding expanding a selected part of a character string, in the case where the hash function currently in use is a hash function that uses 3 bytes, for example, a different hash function that uses 4 bytes, a larger number of bytes than the above-mentioned 3 bytes, may be used. Therefore, for example, the computer (101) may switch a hash function that uses 3 bytes to a hash function that uses 4 bytes.

Expanding a selected part of a character string means looking ahead a larger number of bytes of character strings than the number of bytes selected by the original hash function. Therefore, the number of collisions of a hash value obtained by the switched hash function is smaller than the number of collisions of a hash value obtained by the original hash function.

By making the number of characters used by the switched hash function larger than the number of characters used by the original hash function, the length of entries in a bucket chain newly registered in a hash table can be shortened.

The computer (101) performs switching of the hash function on the fly. In response to completion of switching of a hash function, the computer (101) proceeds to operation 507. In operation 507, the computer (101) determines whether character string data to be processed still remains in the present buffer (103). When character string data to be processed remains, the computer (101) returns to operation 503. When the process returns to operation 503, the computer (101) shifts the character string currently being processed in the buffer (103) by 1 byte, and performs the processing explained above in operation 503 for the next input byte, by using the switched hash function. In contrast, when character string data to be processed no longer remains, the computer (101) proceeds to operation 508.

In operation 508, the computer (101) determines whether the next character strings to be processed exist in the input stream. When the next character strings exist in the input stream, the computer (101) proceeds to operation 509 or returns to operation 502 in order to perform data compression for the next character strings. In contrast, when the next character string does not exist in the input stream, the computer (101) proceeds to termination operation 511.

Operation 509 is optional wherein the computer (101) determines whether the switched hash function is to be restored to the original hash function. For example, when returning to the original hash function is set, the computer (101) proceeds to operation 510.

Operation 510 is also optional. At a specific timing, the computer (101) restores the different hash function switched in operation 506 to the original hash function. The specific timing may be, for example, a timing when a hash table is cleared or every time that character strings of a predetermined number of bytes is processed.

Clearing a hash table may be performed, for example, when new character strings are read from input data or when new input data is read into a sliding window. Therefore, restoring the different hash function switched in operation 506 to the original hash function may be performed immediately before a new input stream is read into a buffer.

With the switched hash function, a short character string which can be found using a hash value calculated from the original hash function, cannot be found. This is because a hash value for a character string selected by the original hash function (for example, a character string with 3 bytes) is generally different from a hash value from a selected character string by a switched hash function (for example, a character string with 4 bytes).

Thus, by restoring the different hash function switched in operation 506 to the original hash function at the specific timing, a character string selected for the original hash function (for example, a character string with 3 bytes) can be found again.

When the different hash function switched in operation 506 is restored to the original hash function, the computer (101) returns to operation 502. When the process returns to operation 502, the computer (101) clears the buffer (103), and reads the next predetermined number of character strings from the input stream into the buffer (103). Then, in the next operation 503, the computer (101) performs the processing explained above in operation 503 by using the restored original hash function.

In operation 511, the computer (101) reads a data compression algorithm into the memory (103), and ends the process for data compression.

As mentioned above, operation 509 and operation 510 are optional. Therefore, after switching to the different hash function is performed in operation 506, the process may return to operation 502 without going through operation 509 and operation 510. In such a case, when the process returns to operation 502, the computer (101) clears the buffer (103), and reads the next predetermined number of character strings from the input stream into the buffer (103). In the next operation 503, the computer (101) performs the processing explained above in operation 503, by using the switched different hash function. Therefore, when the process further proceeds to operation 506, the computer (101) may switch the switched different hash function to an yet another different hash function that further expands a selected part of a character string for the different hash function.

The data compressed according to the flowchart illustrated in FIG. 5 may be decoded in a conventional method, irrespective of whether switching of a hash function has been performed. That is, switching a hash function in data compression does not affect the decoding process.

Figure 6:
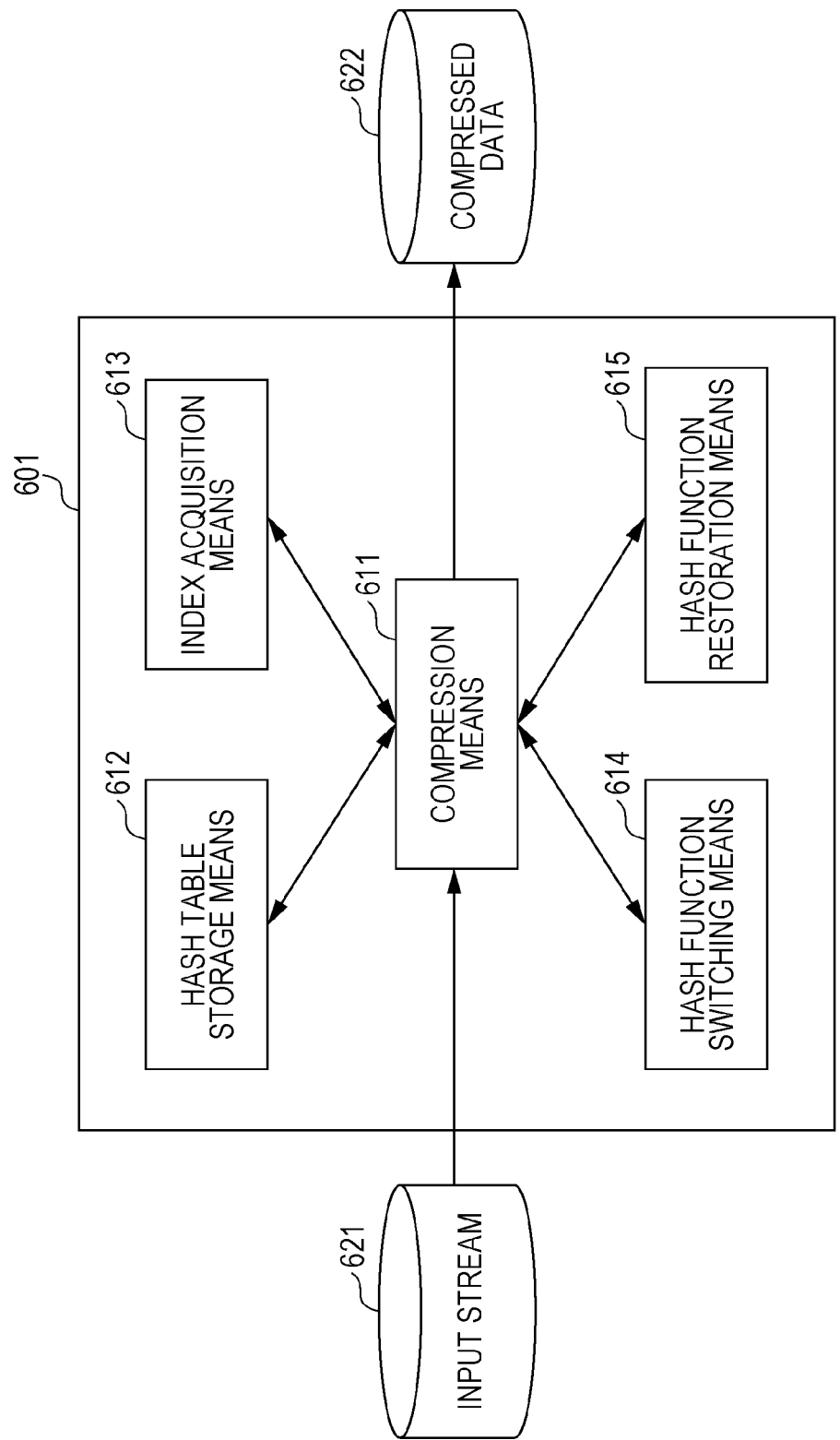
FIG. 6 is a functional block diagram illustrating an example of a computer that preferably includes the hardware configuration according to FIG. 1 and that compresses data according to an embodiment of the present invention.

FIG. 6 is a functional block diagram illustrating an example of a computer that preferably has the hardware configuration according to FIG. 1 and that performs data compression according to an embodiment of the present invention.

A computer (601) is a computer that tests the above-mentioned optimized binary module, according to an embodiment of the present invention, and may be, for example, the computer (101) illustrated in FIG. 1.

The computer (601) includes compression means (611), hash table storage means (612), index acquisition means (613), and hash function switching means (614). Optionally, the computer (601) also includes hash function restoration means (615).

The compression means (611) is able to use a hash table as a dictionary. The compression means (611) executes a desired data compression algorithm for compressing data while dynamically creating a dictionary.

The hash table storage means (612) stores a hash table created by the compression means (611). The hash table may be stored, for example, in the memory (103) or the storage medium (108).

The index acquisition means (613) acquires an index which indicates that a longest matching character string cannot be found in the search through entries in a bucket chain having a hash value which is calculated by applying a hash function to a selected part of a character string and which is previously registered in a hash table, and thus the search operation is wasted. The index may be, for example, the time represented by (1) or (2) mentioned above or the frequency represented by (3) or (4) mentioned above.

When the index acquired by the index acquisition means (613) exceeds a predetermined threshold, the hash function switching means (614) switches the hash function currently in use to a different hash function that expands a selected part of a character string, without reconstructing a hash table.

The hash function restoration means (615) optionally restores the different hash function to the original hash function at a specific timing.

First Embodiment

According to an embodiment of the present invention, data compression is performed for the same file (PDF data having an embedded font) at a default compression level and a maximum compression level by dynamically switching a hash function that uses 3 bytes to a hash function that uses 4 bytes (however, processing of restoring to the original hash function is not performed).

Comparative Example 1

Under the same environment as the first embodiment, data compression is performed for the same file as in the first embodiment at a default compression level and a maximum compression level, by using the hash function that uses 3 bytes, without performing switching of a hash function.

Second Embodiment

According to an embodiment of the present invention, data compression is performed for the same file at a default compression level and a maximum compression level by dynamically switching a hash function that uses 3 bytes to a hash function that uses 4 bytes and further performing processing of restoring to the original hash function.

Comparative Example 2

Under the same environment as the second embodiment, data compression is performed for the same file as in the second embodiment at a default compression level and a maximum compression level by using the hash function that uses 3 bytes, without performing switching of a hash function.

First Embodiment

Default Compression Level

At the default compression level, the performance is improved by about 20 percent (reduction in total execution time), compared to the comparative example 1. As for the file compression size, the file size after compression according to the first embodiment is improved by about 2 percent, compared to the file size after compression according to the comparative example 1.

First Embodiment

Maximum Compression Level

At the maximum compression level, the performance is improved by about 73 percent, compared to the comparative example 1. As for the file compression size, the file size after compression according to the first embodiment is improved by about 2 percent, compared to the file size after compression according to the comparative example 1.

Second Embodiment

Default Compression Level

At the default compression level, the performance is improved by about 13 percent, compared to the comparative example 2. As for the file compression size, the file size after compression according to the second embodiment is improved by about 1 percent, compared to the file size after compression according to the comparative example 2.

Second Embodiment

Maximum Compression Level

At the maximum compression level, the performance is improved by about 61 percent, compared to the comparative example 2. As for the file compression size, the file size after compression according to the second embodiment is substantially the same as the file size after compression according to the comparative example 2.

As is clear from the results in the first embodiment and the second embodiment described above, according to an embodiment of the present invention, a significant improvement in the performance may be achieved while maintaining substantially the same file size after compression.

The invention claimed is:

1. An apparatus for performing data compression, comprising:
    a computing device configured to apply a hash function to a selected part of a character string to calculate a hash value, search, using the hash value, through entries in a bucket chain having the hash value previously registered in a hash table, and find a longest matching character string, the computing device further comprising:
    index acquisition means for acquiring an index indicating that a longest matching character string cannot be found in the search through the entries and thus the search operation is wasted; and
    hash function switching means for switching the hash function to a different hash function for expanding the selected part of the character string, without reconstructing the hash table, when the index exceeds a predetermined threshold.

2. The apparatus of claim 1, further comprising hash function restoration means for restoring the different hash function to the original hash function at a specific timing.

3. The apparatus of claim 2, wherein the restoration means restores the different hash function to the original hash function at a time when the hash table is cleared or every time that character strings of a predetermined number of bytes is processed.

4. The apparatus of claim 1, wherein the index represents a time required for a search when an entry of a character string being searched for cannot be found up to the last entry in the bucket chain having the hash value or up to a search upper limit for the entries in the bucket chain having the hash value.

5. The apparatus of claim 1, wherein the index represents a frequency at which an entry of a character string being searched for cannot be found even when the search is performed up to the last entry in the bucket chain having the hash value or even when the search is performed up to a search upper limit for the entries in the bucket chain having the hash value.

6. A non-transitory, computer readable storage medium having computer readable instructions stored thereon that, when executed by a computer, implement a method of performing data compression, the method comprising:
   applying a hash function to a selected part of a character string to calculate a hash value;
   searching, using the hash value, through entries in a bucket chain having the hash value previously registered in a hash table, and finding a longest matching character string;
   acquiring, an index indicating that a longest matching character string cannot be found in the search through the entries and thus the search operation is wasted; and
   switching the hash function to a different hash function for expanding the selected part of the character string, without reconstructing the hash table, when the index exceeds a predetermined threshold.

7. The storage medium of claim 6, wherein the method further comprises restoring the different hash function to the original hash function at a specific timing.

8. The storage medium of claim 7, wherein restoring the different hash function to the original hash function is performed at a time when the hash table is cleared or every time that character strings of a predetermined number of bytes is processed.

9. The storage medium of claim 6, wherein the index represents a time required for a search where an entry of a character string being searched for cannot be found up to the last entry in the bucket chain having the hash value or up to a search upper limit for the entries in the bucket chain having the hash value.

10. The storage medium of claim 6, wherein the index represents a frequency at which an entry of a character string being searched for cannot be found even when the search is performed up to the last entry in the bucket chain having the hash value or even when the search is performed up to a search upper limit for the entries in the bucket chain having the hash value.

* * * * *